United States Patent
Ogawa et al.

(10) Patent No.: US 6,727,654 B2
(45) Date of Patent: Apr. 27, 2004

(54) PLASMA PROCESSING APPARATUS

(75) Inventors: Unryu Ogawa, Tokyo (JP); Takayuki Sato, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 09/756,873

(22) Filed: Jan. 10, 2001

(65) Prior Publication Data

US 2002/0047536 A1 Apr. 25, 2002

(30) Foreign Application Priority Data

Jan. 11, 2000 (JP) ..................................... 2000-002804

(51) Int. Cl.$^7$ ............................................ H05B 31/26
(52) U.S. Cl. ............................ 315/111.01; 315/111.21; 118/723 I
(58) Field of Search ................ 315/111.01, 111.21, 315/111.31, 111.71, 111.91; 313/281, 282, 283; 118/723 I, 723 E, 723 MP; 156/345

(56) References Cited

U.S. PATENT DOCUMENTS

| | | | | |
|---|---|---|---|---|
| 4,847,466 A | * | 7/1989 | Pasquini et al. | 315/111.21 |
| 5,383,984 A | * | 1/1995 | Shimada et al. | 156/345 |
| 5,554,223 A | * | 9/1996 | Imahashi | 118/723 I |
| 6,171,438 B1 | * | 1/2001 | Masuda et al. | 156/345 |
| 6,211,622 B1 | * | 4/2001 | Ryoji et al. | 315/111.21 |
| 6,481,370 B2 | * | 11/2002 | Kazumi et al. | 118/723 I |

FOREIGN PATENT DOCUMENTS

| | | | |
|---|---|---|---|
| JP | 2-241034 | 9/1990 | |
| JP | A 07-201831 | 8/1995 | ....... H01L/21/3065 |
| JP | A 07-230956 | 8/1995 | ......... H01L/21/205 |
| JP | A 08-306633 | 8/1996 | ......... H01L/21/205 |
| JP | B2 07-110996 | 11/1996 | |
| JP | 09204480 | * 7/1997 | ............ H05H/1/46 |
| JP | A 11-121198 | 4/1999 | ............ H05H/1/46 |

OTHER PUBLICATIONS

U.S. patent application Ser. No. 09/123,352, Li et al., filed Jul. 1998.
U.S. patent application Ser. No. 09/234,488, Li et al., filed Jan. 1999.
U.S. patent application Ser. No. 09/573,253, Li et al., filed May, 2000.

* cited by examiner

Primary Examiner—Don Wong
Assistant Examiner—Jimmy T. Vu
(74) Attorney, Agent, or Firm—Oliff & Berridge, PLC

(57) ABSTRACT

The invention provides a plasma processing apparatus, in which the uniformity of the plasma density can be improved, and the electron temperature can be kept low. A vacuum vessel 21 for generating a plasma includes an upper vessel 22 that is dome-shaped and formed in one seamless piece, and a lower vessel 23 fastened tightly on a lower aperture portion 24 of the upper vessel 22 with a sealing member. The plasma processing apparatus is provided with a supply port 26 for supplying gas to the vacuum vessel 21 and an exhaust port 34 for exhausting gas. An electrode 29 for applying high-frequency power to ionize the gas is provided not in the vacuum vessel 21 but in ring-shape outside the vacuum vessel 21. On the outer side of this tubular electrode 29, a pair of tubular magnets 30 are provided, which form magnetic force lines that intersect perpendicularly with the electric field.

18 Claims, 8 Drawing Sheets

PLASMA PROCESSING APPARATUS

BACKGROUND OF THE INVENTION

1. Field of the Invention

The present invention relates to modified magnetron high-frequency discharge plasma processing apparatuses, and in particular to apparatuses performing various kinds of processes using a plasma, plasma etching apparatuses for dry etching with a plasma, for example, films formed on the surface of a substrate to be processed, and plasma CVD (chemical vapor deposition) apparatuses for forming thin films on the surface of a substrate to be processed using gas phase reactions induced by a plasma.

2. Description of the Related Art

In recent years, plasma processing is increasingly used in the manufacturing process for a variety of semiconductor devices, liquid crystal displays, and solar batteries. The active species and ions generated in a plasma are used to etch a silicon oxide film formed on a silicon semiconductor as one method for dry etching, for example. With the increasing integration of semiconductor devices, wiring is laid out in multiple layers, so that insulating films between the wiring layers (interlayer insulating films) have to be provided. One known method for forming a film on the surface of a substrate is to introduce a reaction gas into the reaction chamber where the process is performed, and add heat to cause the gas to react. However, for this method, relatively high temperatures are necessary, so that there are many defects in the devices, and recently plasma CVD is often used, in which the energy that is necessary for the activation of the reaction is inferred by a plasma induced by glow discharge. Moreover, films for solar batteries are also formed by plasma CVD.

In dry etching, which is a typical plasma process, there is a need for uniform high-density plasmas suitable for substrates with larger surface areas with which the throughput of the apparatus can be increased, and for increased processing precision and selectivity, suitable for finer electronic device structures and a larger number of layers. There is also a need for plasmas with higher uniformity, so as to reduce charge-up damage. The development of a variety of plasma sources supposed to satisfy these needs is progressing.

However, although the density of plasmas generated with ECR (electron cyclotron resonance) plasma sources, ICP (inductively coupled plasma) plasma sources, and high-density plasma sources using surface microwaves plasma sources and helicon waves plasma sources is sufficient, it is currently impossible to ensure uniformity within Ø300 mm. In addition, in these high-density plasma sources, the electron temperature of the plasma has to be kept low, so as to suppress excessive ionization of the plasma gas. Especially with regard to etching silicon oxide films, high-density plasma sources addressing these requirements are still under development, and lower etching selectivity due to excessive ionization of the gas and charge accumulation at the substrate surface are still big problems.

In etching processes using current high-density plasma sources, the lower selectivity with respect to the underlying silicon when etching small silicon oxide film contact holes, undesired side etching due to charge build-up when etching gate polysilicon electrodes, and insulation breakdown of the gate oxide film are real problems. It seems that these phenomena are caused by large electron temperatures (that is, the presence of high-energy electrons) in the low-pressure high-density plasma. But low-pressure and high-density plasmas are necessary for plasma CVD processes.

SUMMARY OF THE INVENTION

It is an object of the present invention to provide a plasma processing apparatus, in which the uniformity of the plasma density can be increased, and the electron temperature can be kept low.

A plasma processing apparatus in accordance with the present invention includes a vacuum vessel made of a dielectric material, such as quartz or alumina, defining a plasma processing region in its inside; a gas supply/exhaust system that supplies/exhausts gas to/from the vacuum vessel; a tubular first electrode disposed around the periphery of the vacuum vessel and inducing discharges in the gas supplied to the vacuum vessel; a magnet disposed around the periphery of the vacuum vessel; and a high-frequency power apply system that applies high-frequency power to the tubular first electrode; wherein applying high-frequency power to the tubular first electrode generates a plasma inside the vacuum vessel. Here, "tubular" includes the shapes of, for example, circular, elliptical and polygonal rings, tubes and sleeves. The magnet can be a permanent magnet or an electromagnet, for example.

In accordance with this invention, gas is supplied by the gas supply system to the inside of the vacuum vessel, and the atmosphere inside the vacuum vessel is exhausted by the gas exhaust system. Moreover, a predetermined magnetic field is formed by the magnet. Furthermore, high-frequency power is applied by the high-frequency power apply system to the first electrode. Thus, a predetermined high-frequency electric field is formed. As a result, the electrons emitted from the first electrode are trapped in magnetron motion. Thus, a plasma having a high density is generated near the first electrode. Due to diffusion, a portion of this plasma moves toward the central portion of the plasma processing region. Thus, a plasma that has a high and uniform density is generated across the entire plasma processing region. As a result, it becomes possible to generate a plasma having a uniform density across a region of 30 mm diameter.

Moreover, in accordance with this invention, it is also possible to keep the electron temperature of the plasma low. Thus, the decrease of the etching selectivity and the charge density at the substrate surface can be reduced.

Furthermore, in accordance with this invention, the tubular first electrode does not form part of the wall of the vacuum vessel wall, because the tubular first electrode is arranged outside the vacuum vessel. Therefore, different to apparatuses in which a tubular electrode is sandwiched by portions of the vacuum vessel through insulating rings, it is not necessary to provide sealing members between the wall of the vacuum vessel and the insulating rings, and between the insulating rings and the tubular electrode. As a result, the assembly of the apparatus is simplified. Moreover, the number of sealed locations can be reduced, so that the apparatus is suitable for high vacuums in the vacuum vessel.

Furthermore, in accordance with the present invention, the surface of the first electrode can be prevented from contacting the plasma by arranging the first electrode outside the vacuum vessel. Thus, metal contamination caused when plasma damages are inflicted on the first electrode can be prevented.

Moreover, in the present invention, when the vacuum vessel is made of a dielectric material, such as quartz or alumina ($Al_2O_3$), plasma damages at the wall of the vacuum vessel as when the vacuum vessel is made of metal do not occur, and metal contamination of the substrate to be processed in the vacuum vessel caused by plasma damages can be effectively prevented.

From the above, in accordance with the present invention, metal contamination can be effectively avoided for processes near the gate, such as spacer films or gate dielectric films.

Furthermore, in accordance with the present invention, the vacuum vessel in the present invention is made of a dielectric material, so that there is no need to arrange a conducting material, such as an aluminum chamber, near the tubular first electrode. Therefore, electric power losses can be reduced considerably, and the efficiency of the plasma process can be improved.

It is preferable that the vacuum vessel comprises an upper vessel and a lower vessel, and that the upper vessel is dome-shaped and formed in one seamless piece, except that it has an open bottom portion. If the upper vessel is dome-shaped and formed in one seamless piece, then the assembly of the vacuum vessel becomes even easier.

It is preferable that the vacuum vessel has shower holes for uniformly supplying the gas, and that a susceptor, on which a substrate to be processed is placed, is arranged at a position facing the shower holes. With this configuration, the gas flow becomes uniform, and the substrate is plasma processed with greater uniformity.

It is preferable that a second electrode is arranged at an outer peripheral portion of the shower holes, outside the vacuum vessel. If high-frequency power is supplied jointly to the first electrode and the second electrode, then the plasma processing efficiency at the periphery of the processed substrate (the edge portion of a plasma processing region) can be controlled with the first electrode, and the plasma processing efficiency at the center of the processed substrate (the central part of the plasma processing region) can be controlled with the second electrode, so that the uniformity with which the substrate is plasma processed can be improved. Moreover, for the gas cleaning near the shower holes, the etching speed can be increased with the second electrode, thereby improving the cleaning efficiency.

It is also possible to arrange the second electrode not at an outer peripheral portion of the vacuum vessel portion provided with the shower holes, but on the inlet side of the shower holes, which is opposite the side of the plasma processing region of the vacuum vessel. If the plasma processing is plasma CVD processing, then a film is also deposited on the inside of the vacuum vessel, so that gas cleaning has to be performed regularly, and the film formation in the vacuum vessel is most pronounced near the shower holes. For the gas cleaning near the shower holes, the etching speed can be increased with the second electrode on the inlet side of the shower holes, which is opposite the side of the plasma processing region, thereby improving the cleaning efficiency.

If the second electrode is arranged on the inlet side of the shower holes, then it is preferable that the second electrode is in contact or proximity to a wall of the vacuum vessel that is provided with the shower holes, and that the second electrode is provided with gas flow holes at positions corresponding to the shower holes. With this configuration, when the second electrode is in contact or proximity to a wall of the vacuum vessel that is provided with the shower holes, gas can still be supplied from the shower holes without being obstructed by the second electrodes. Moreover, the cleaning efficiency can be improved even further, because the second electrode is in contact or proximity to a wall of the vacuum vessel.

It is preferable that the gas flow holes of the second electrode are larger than the shower holes. With this configuration, the flow of gas that is supplied through the shower holes is not obstructed, even when the positions of the gas flow holes of the second electrode with respect to the shower holes have shifted during assembly. Moreover, since the diameter of the shower holes provided on the side of the plasma processing region is not that large, abnormal plasma discharges do not occur.

The magnet can also be formed by arranging a plurality of permanent magnets around the vacuum vessel. With this configuration, the handling and the magnetization of the magnet is easier than if the magnet is made of only one magnet.

In this case, the plurality of permanent magnets can be held in place, for example, by providing a magnet holder having a plurality of fitting holes, and fitting the permanent magnets into the fitting holes of the magnet holder. With this configuration, it is easy to hold a plurality of permanent magnets in place.

Alternatively, it becomes possible to hold the plurality of permanent magnets in place by sandwiching them between the first electrode and a magnetic yoke forming a magnetic circuit. With this configuration, the operation of holding the plurality of permanent magnets in place can be performed easier than with the above-described configuration using a magnet holder. Moreover, the magnetic field in the circumferential direction of the vacuum vessel can be made more uniform than with the above-described configuration using a magnet holder. This is, because the plurality of permanent magnets can be lined up without gaps, and the permanent magnets can be provided with a rectangular or square profile. Moreover, the length of the permanent magnets (that is, the length in the direction connecting the two poles) can be made shorter than with the above-described configuration using a magnet holder. This is, because there is no need to secure the stroke for fitting the permanent magnets into the fitting holes. Thus, it becomes possible to make the permanent magnets plate-shaped. As a result, it becomes possible to make the apparatus smaller than with the above-described configuration using a magnet holder.

DESCRIPTION OF THE PREFERRED EMBODIMENTS

The following is a description of the preferred embodiments of plasma processing apparatus in accordance with the present invention.

Figure 1:
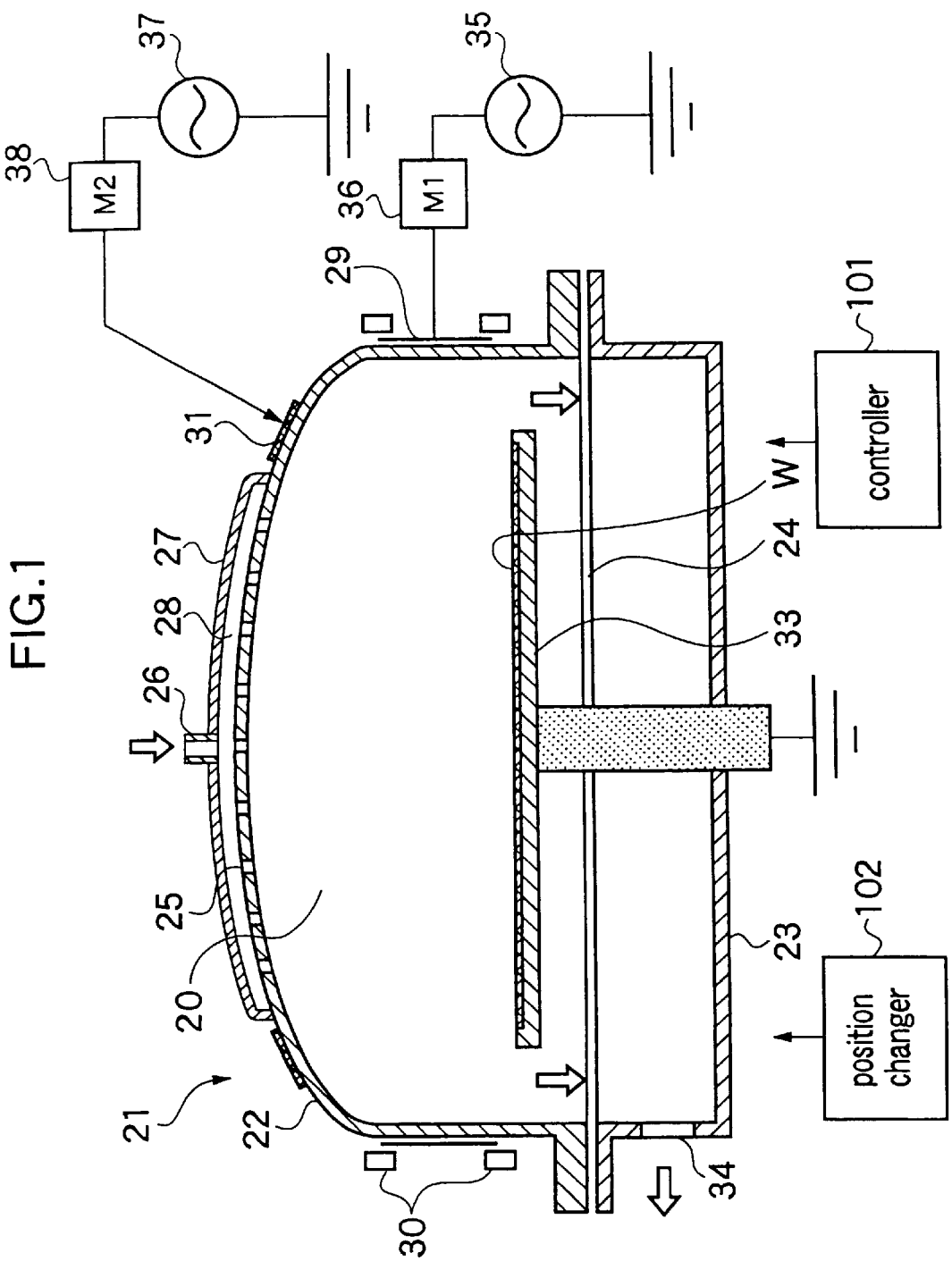
FIG. 1 shows a schematic cross-sectional view of a plasma processing apparatus in accordance with an embodiment the present invention.

FIG. 1 is a schematic cross-sectional view showing an embodiment of the present invention. Before explaining the configuration of the plasma processing apparatus shown in FIG. 1, the configuration of the plasma processing apparatus in FIG. 10 shall be explained.

Figure 10:
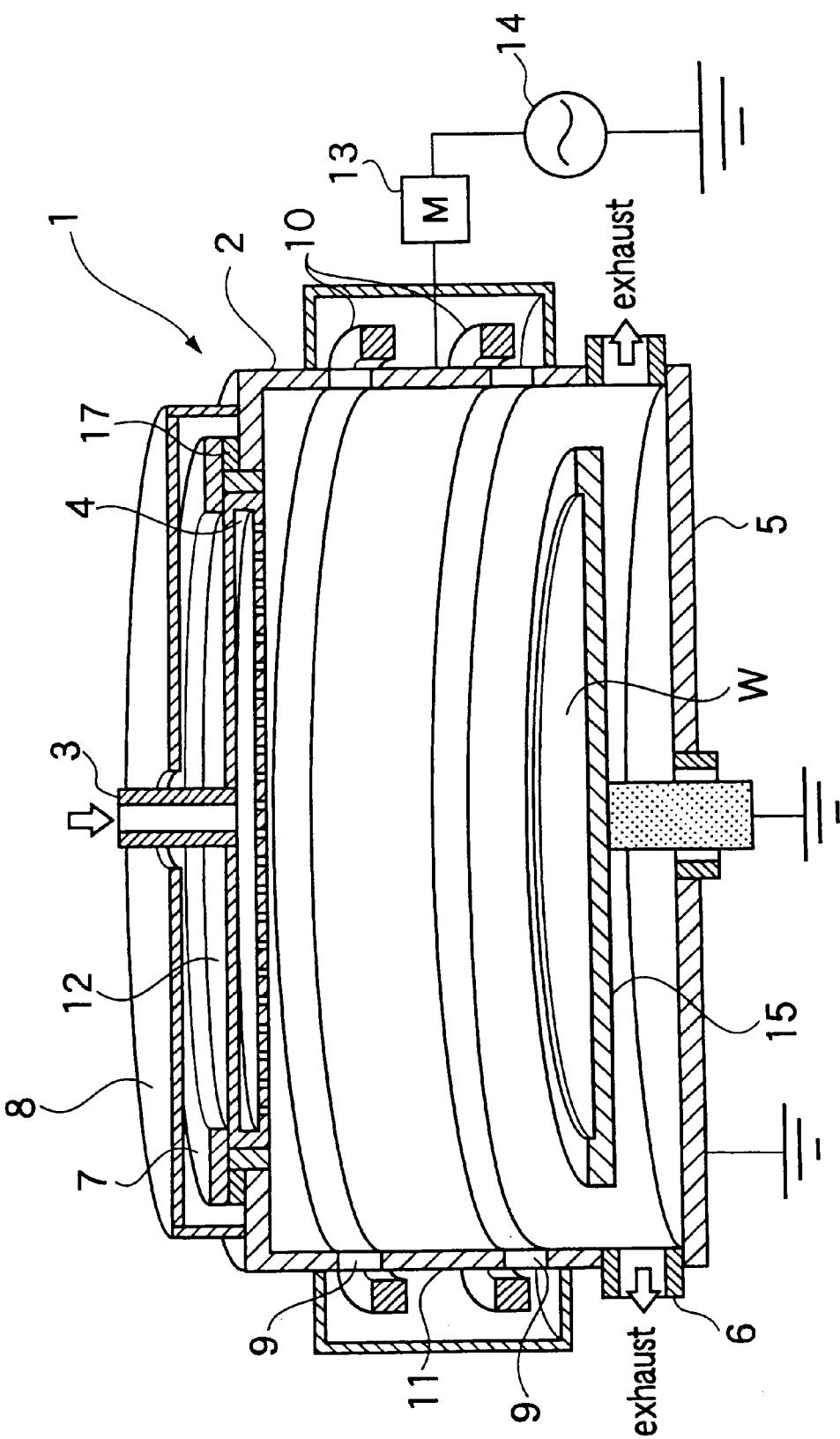
FIG. 10 is a cross-section of the configuration of a plasma processing apparatus shown to explain the plasma processing apparatus of the present invention.

FIG. 10 is a schematic cross-sectional view showing an example of a configuration of a plasma processing apparatus as invented by the inventors of this application in order to solve the above-described problems of high-density plasma sources, such as ECR plasma sources. This plasma processing apparatus is configured as a modified magnetron high-frequency emission type plasma processing apparatus, which is a modification of a magnetron high-frequency emission type plasma processing apparatus.

That is, this plasma processing apparatus includes a tubular vacuum vessel main unit 2 made of metal with open top and bottom, a gas supply port 3 for supplying gas from the top of the vacuum vessel main unit 2 to the vacuum vessel 1, a gas dispersion chamber 4 fitted into an upper aperture of the vacuum vessel main unit 2 for dispersing gas that is supplied from the gas supply port 3, a bottom plate 5 made of metal for sealing the lower aperture of the vacuum vessel main unit 2, and an exhaust port 6 for exhausting gas from the bottom of the vacuum vessel 1. A tubular presser member 7 for pressing the gas dispersion chamber 4 and a sealing member 17 against the vacuum vessel main unit 2 and a cover 8 covering the presser member 7 have to be provided at the top of the vacuum vessel 1. Moreover, the vacuum vessel main unit 2 is divided into an upper and a lower portion, and a metal RF electrode 11 for inducing a discharge in the gas supplied into the vacuum vessel 1 is provided, sandwiched by two insulating rings 9 between the upper and the lower portion.

Two tubular magnets 10 for forming magnetic lines that are substantially parallel to the axis of the tubular RF electrode 11 are arranged outside the vacuum vessel 1, in correspondence to the two insulating rings 9. Also a high-frequency power source 14 for applying high-frequency power (13.56 MHz) through a matching circuit 13 to the tubular RF electrode 11 is arranged outside the vacuum vessel 1. An electrically grounded susceptor 15 is disposed inside the vacuum vessel 1, and the substrate W to be processed is placed on top of it. A high-frequency electric field is built up by applying high-frequency power between the RF electrode 11 and the electrically grounded susceptor 15, and a plasma is generated inside the vacuum vessel 1. Thus, the electrons in the plasma are confined by the orthogonal electromagnetic field, and the gas is ionized efficiently, thereby producing a plasma.

With the modified magnetron high-frequency discharge plasma processing apparatus of this configuration, a tubular plasma that is strong near the surface of the RF electrode 11 (the edge portion of the plasma processing region) can be produced by introducing a certain gas from the gas supply port 3 after evacuation of the vacuum vessel 1, and applying high-frequency power to the RF electrode 11 with the high-frequency power source 14. The density of this plasma is sufficient, and the plasma generated at the surface of the RF electrode 11 disperses and results in a substantially uniform plasma density at the substrate W placed on the susceptor 15, with a uniformity that can be sufficiently maintained over a diameter of 300 mm. Moreover, the electron temperature of the plasma can be kept low, and it becomes possible to reduce the deterioration of the etching selectivity as well as charge accumulation at the substrate surface.

As described above, with the plasma processing apparatus shown in FIG. 10, it becomes possible to ensure the uniformity of the plasma density and to keep the electron temperature of the plasma low.

However, in such a plasma processing apparatus, it is still necessary to consider the following aspects:

(1) Because the tubular RF electrode 11 forms part of the side wall of the vacuum vessel 1, it is necessary to provide a number of sealing members between the wall of the vacuum vessel and the insulating rings 9, between the insulating rings 9 and the tubular RF electrode 11, and elsewhere. Thus, there is a possibility that the assembly is difficult. Moreover, since many locations have to be sealed, there is a possibility that setting high vacuum is difficult.

(2) The surface of the metal RF electrode 11 is in direct contact with the plasma. In semiconductor manufacturing processes, a configuration in which the plasma comes in contact with a metal surface of, for example, aluminum may be acceptable for manufacturing processes, in which metal contamination is not an issue, such as a manufacturing process of interlayer insulating films. However, in manufacturing processes near the gate, for example in a manufacturing process of spacer films or gate dielectric films, metal contamination has to be avoided. Accordingly, there is a possibility that it is difficult to apply the plasma processing apparatus shown in FIG. 10 to manufacturing processes near the gate of LSI, which are more demanding with regard to metal contamination.

(3) The vacuum vessel 1 is made of metal, and a conductive material, such as an aluminum chamber, is arranged near the RF electrode, so that the high-frequency electric field is concentrated in a narrow region. Therefore, the region where the plasma is generated is small, and there is a possibility that the plasma processing efficiency decreases.

Accordingly, in the plasma processing apparatus shown in FIG. 1, the vacuum vessel 21 is made of a dielectric material, such as quartz or alumina, and the discharge electrode 29 for discharging the gas is disposed outside the vacuum vessel 21.

With this configuration, the discharge electrode 29 is not a structural element of the vacuum vessel 21, so that the vacuum vessel 21 can be assembled easily, and the vacuum degree in the vacuum vessel 21 can be increased.

Moreover, the discharge electrode 29 does not come in direct contact with the plasma, so that metal contamination due to plasma damages inflicted on the discharge electrode 29 can be prevented.

Furthermore, the vacuum vessel 21 is not made of metal, so that metal contamination due to plasma damages inflicted on the discharge electrode 29 can be prevented.

And furthermore, the arrangement of conductive material near the discharge electrode 29 can be avoided, so that a reduction of the plasma processing efficiency can be prevented.

The following is a detailed explanation of the plasma processing apparatus shown in FIG. 1. In this plasma processing apparatus, the vacuum vessel 21 includes an upper vessel 22 and a lower vessel 23. The upper vessel 22 is dome-shaped and formed in one seamless piece, except that it has an open bottom portion. Also the lower vessel 23 is formed in one seamless piece, except that it has an open top portion. The lower aperture portion 24 of the upper vessel 22 is fastened tightly to the lower vessel 23 with a sealing member, such as an O-ring (not shown in the drawing), to maintain a vacuum, and the plasma processing apparatus 20 is arranged inside this vacuum vessel 21. The vacuum vessel 21 is made of a dielectric material, such as quartz, alumina or another ceramic. When the vacuum vessel 21 is made of a dielectric material, it becomes possible to adjust the temperature of the walls of the vacuum vessel 21 to relatively higher temperatures, if necessary. This makes it possible to reduce the particles generated at the vacuum vessel walls during the processing.

A multitude of shower holes 25 for uniformly supplying gas is formed in the top portion of the vacuum vessel 21, whereby the flow of gas supplied to the inside of the vacuum vessel 21 is made uniform, and the uniformity with which the processed substrate W is plasma processed is improved. The vacuum container 21, in which the gas shower holes 25 are formed, is made of a dielectric material, so that metal contamination from the gas shower holes 25 can be suppressed to a minimum. The top portion of the vacuum vessel 21, in which the shower holes 25 are formed, is covered by a cover 27 having a gas supply port 26 in its center as a gas supply means, and the inside of the top portion is provided with a gas dispersion chamber 28, which spreads the gas that is supplied from the gas supply port 26 over the multitude of shower holes 25. Moreover, the gas dispersion chamber 28 also fulfills the purpose of mixing gases, if two or more gases are used.

The outer wall of the vacuum container 21 is provided with a, for example, tubular discharge electrode 29 forming a high-frequency electric field for magnetron discharge and inducing discharges in the gas that has been supplied to the vacuum vessel 21. The discharge electrode 29 is made, for example, of aluminum or of a material that has been surface-treated with aluminum. This discharge electrode 29 constitutes a tubular first electrode. The outer wall of the vacuum vessel 21 is also provided with a pair of upper and lower tubular permanent magnets 30. These permanent magnets 30 are arranged in rings, enclosing the tubular discharge electrode 29. The pair of permanent magnets 30 is magnetized radially and with mutually opposing polarity. Thus, magnetic force lines having a component that is substantially parallel to the axis of the tubular discharge electrode 29 are generated, which run along the inner surface of the tubular discharge electrode 29 along the tube axis direction.

Figure 2:
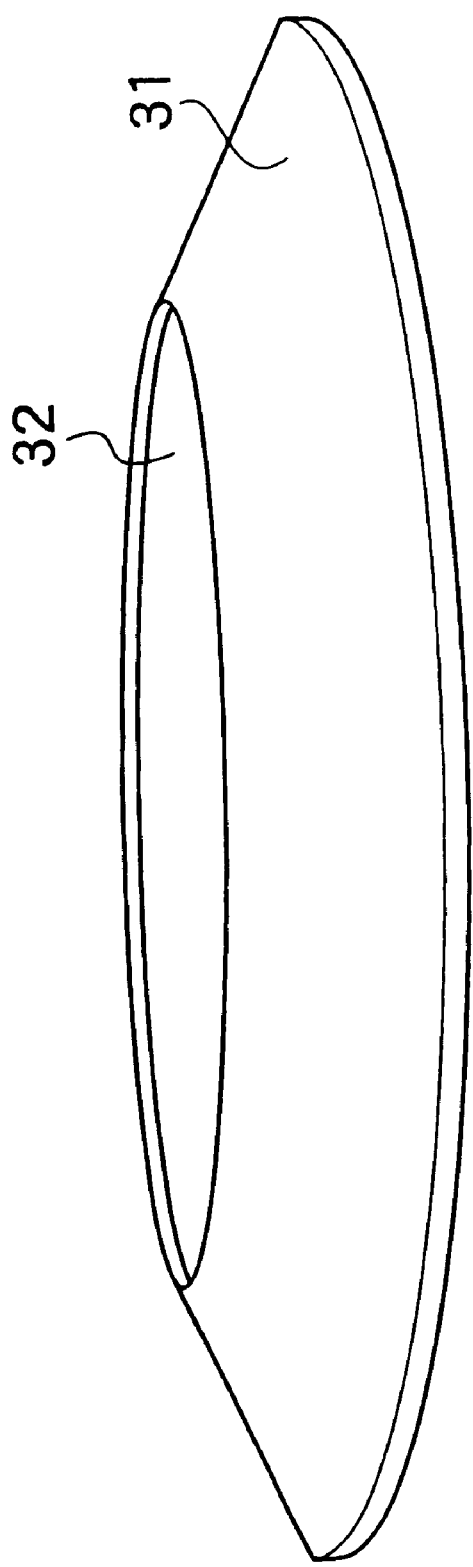
FIG. 2 is a schematic diagram of the auxiliary electrode in this embodiment.

Moreover, a tubular auxiliary electrode 31 is provided as a second electrode at the outer side of the vacuum vessel 21 around the top portion of the vacuum vessel 21 with the shower holes 25. The auxiliary electrode 31 is made, for example, of aluminum or a material that has been surface-treated with aluminum. Thus, it becomes possible to control the plasma processing efficiency at the periphery of the processed substrate W (the edge portion of plasma processing region 20) with the discharge electrode 29 and at the center of the processed substrate W (the central portion of the plasma processing region 20) with the auxiliary electrode 31. As shown in FIG. 2, the auxiliary electrode 31 is provided with an aperture portion 32, through which the gas dispersion chamber 28 provided for example at the center of the vacuum vessel 21 is passed. The auxiliary electrode 31 is slanted radially to the outside like an umbrella, and can be fitted tightly to the outer side of the vacuum vessel 21, adjusted to the sloping of the upper portion of the vacuum vessel 21.

The lower portion of the vacuum vessel 21 is provided with a susceptor 33 on which the substrate W to be processed (for example, a silicon wafer) is placed. The susceptor 33 is electrically grounded, so as to put it to the lowest potential. High-frequency power is applied between the susceptor 33 and the tubular discharge electrode 29. The susceptor 33 is provided at a position that faces the shower holes 25. To heat the substrate W to be processed, a susceptor 33 is used, in which, for example, a resistance heater is embedded, or the substrate W is heated with infrared light using a lamp, or a plasma is generated with an inert gas, and the substrate W is heated with its energy. Here, the susceptor 33 is provided with a ceramic heater (not shown in the drawing) made of a heat-resistant, fluorine plasma-resistant material, such as aluminum nitride, and can be heated to high temperatures and adapted to processes that require high substrate temperatures during the formation of films like low-hydrogen nitride films. The lower vessel 23, which is fastened tightly on the lower aperture portion 24 of the vacuum vessel 21, is provided with an exhaust port 34 as an exhaustion means for exhausting gas in arrow direction from the vacuum vessel 21.

The tubular discharge electrode 29 is connected to a first high-frequency power source 35, which supplies high-frequency power to the discharge electrode 29 through a matching circuit 36. Moreover, the tubular auxiliary electrode 31 is connected to a second high-frequency power source 37, which supplies high-frequency power to the auxiliary electrode 31 through a matching circuit 38.

Figure 3:
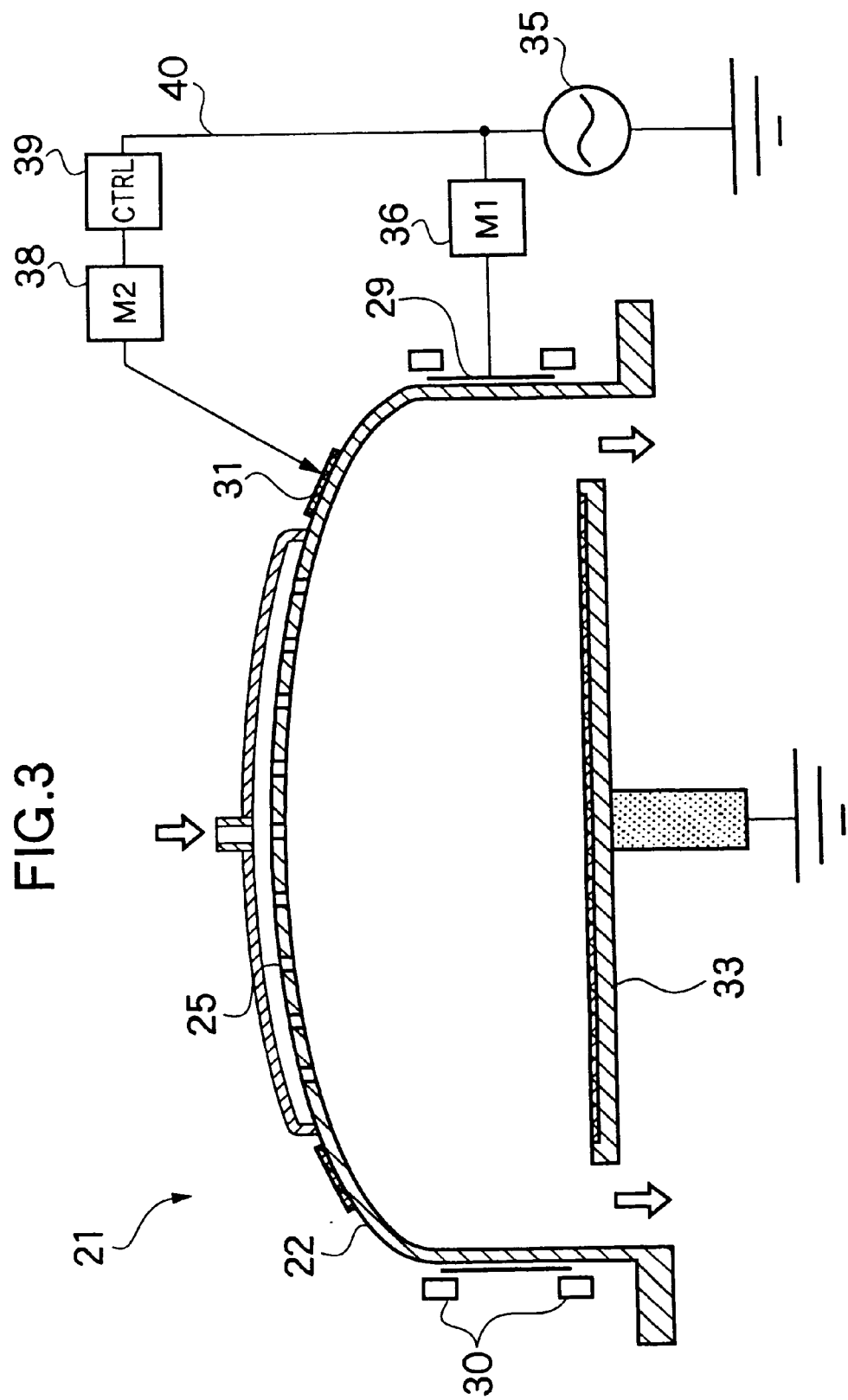
FIG. 3 is a schematic diagram of a plasma processing apparatus in an embodiment, in which the number of high-frequency sources has been reduced.

As shown in FIG. 3, it is also possible to connect the auxiliary electrode 31 and the tubular discharge electrode 29 to a common high-frequency power source 35 to supply both with high-frequency power. Using such a common high-frequency power source 35, the number of high-frequency power sources can be reduced, which is advantageous for reducing the cost of the apparatus. In this case, it is preferable that the high-frequency power supply circuit 40 on the side of the auxiliary electrode is provided with a control device 39 controlling the high-frequency current supplied to the auxiliary electrode 31. If the auxiliary electrode 31 and the tubular discharge electrode 29 are simply connected together, then the resulting high-frequency current may become extremely lopsided, because the surface area ratio of the two electrodes 29 and 31 is different, and also the plasma at the electrode surfaces is different. To prevent this, it is advantageous to provide the high-frequency power supply circuit 40 of the auxiliary electrode 31 with a device 39 that controls the high-frequency current, and to control the ratio of the high-frequency current flowing to the auxiliary electrode 31 and to the tubular discharge electrode 29.

In FIG. 1, numeral 101 denotes a controller that controls the various processes in the plasma processing apparatus. Processes that are controlled by this control portion 101 include, for example, the supplying of gas to the vacuum vessel 11, the exhausting of the atmosphere from the vacuum vessel 11, and the controlling of the high-frequency power that is output by the high-frequency sources 35 and 37.

Numeral 102 denotes a position changer that changes the vertical position of the discharge electrode 29 and the magnet 30. This position changing portion 102 can be configured, for example, as a lift mechanism or a slide mechanism.

Referring to FIG. 19 the following is an explanation of the procedure for substrate processing. The substrate W to be processed is conveyed by a substrate conveying means (not shown in the drawings) onto the susceptor 33 in the vacuum vessel 21, and the vacuum vessel 21 is evacuated using an exhaust source (not shown in the drawings). Then, the substrate W is heated by a heater to a temperature that is suitable for processing. Since it is heated with a ceramic heater made of a material with strong resistance against the plasma, the substrate W can be heated to a broad temperature range of 300 to 500° C. Therefore, it is also possible to form films such as low-hydrogen nitride films, which conventionally depended increasingly on thermal CVD apparatuses, because they require high temperatures. After the substrate W has been heated to a predetermined temperature, process gas is supplied from a process gas supply line (not shown in the drawings) serving as a gas supply means to the vacuum vessel 21, which is made of a dielectric material, through the gas supply port 26 and the shower holes 25. At this time, the atmosphere inside the vacuum vessel 21 is exhausted through the exhaust port 34, and the pressure inside the vacuum vessel 21 is set to a predetermined reduced pressure.

At the same time, high-frequency power is applied to the tubular discharge electrode 29 with the first high-frequency power source 35. Thus, a high-frequency electric field is formed near the discharge electrode 29 (the edge portion of the plasma processing region 20), which has a component pointing toward the center. Moreover, a magnetic field having a component that is parallel to the axial direction of the discharge electrode 29 is formed by the permanent magnets 30. Thus, the magnetic field and the high-frequency electric field crossing at right angles are formed near the discharge electrode 29. As a result, the electrons emitted from the discharge electrode 29 are trapped in magnetron motion. This magnetron motion ionizes the gas. And, the magnetron emission forms a plasma having high density near the discharge electrode 29, for example.

A portion of the plasma moves toward the central portion of the plasma processing region 20, due to diffusion for example. Thus, a plasma is generated that has high and uniform density across the entire plasma processing region 20. With this plasma, a substrate W placed on the susceptor 33 can be processed. Thus, the processed substrate W is processed with a plasma having a high and uniform density.

High-frequency power is applied with the second high-frequency source 37 to the auxiliary electrode 31. Thus, a high-frequency electric field pointing in the center axis direction of the discharge electrode 29 is formed, for example, at the central portion of the plasma processing region 20. As a result, high-energy electrons trapped by the magnetic lines formed by the permanent magnets 30 oscillate at high frequency in the center axis direction of the discharge electrode 29. This high-frequency oscillation generates a discharge that is different from the magnetron discharge. Thus, the plasma density at the central portion of the plasma processing region 20 is increased. As a result, the plasma density and uniformity across the entire plasma processing region 20 are increased.

During the continuous process from stopping the gas supply until stopping the supply of the high-frequency field, the exhaust system, which includes the exhaust port 34, maintains a predetermined pressure inside the vacuum vessel. After the processing is terminated, the substrate W is conveyed out of the vacuum vessel 21 using the convey system.

With this embodiment, using magnetron discharge and diffusion, a plasma is generated, that has a high and uniform density across the entire plasma processing region 20.

Also, with this embodiment, the electron temperature of the plasma can be kept low. Thus, the decrease in etching selectivity and the charge density at the substrate surface can be reduced.

Furthermore, with this embodiment, the tubular discharge electrode 29 does not form a part of the wall of the vacuum vessel 21, because it is arranged outside the vacuum vessel 21. Therefore, different to an apparatus, in which a tubular discharge electrode 29 is sandwiched by parts of the vacuum vessel 21 between insulating rings, there is no need to provide sealing members between the wall of the vacuum vessel 21 and the insulating rings, or between the insulating rings and the tube-shaped electrodes. As a result, the number of components can be reduced, the assembly of the apparatus becomes easier, and the manufacturing costs of the apparatus can be reduced. Moreover, a sealing is provided at only one location, namely between the upper vessel 22 and the lower vessel 23, and the number of locations where sealings are provided can be reduced greatly, so that also high-degree vacuums can be generated inside the vacuum vessel 21. As a result, it becomes possible to maintain pressures over an extremely broad pressure range of 0.1 Pa to 10 Pa in the vacuum vessel 21. Consequently, it becomes possible, for example, to generate a high-density plasma at low pressures, so that high quality films can be formed at high speeds, and it becomes possible to form buried films.

In semiconductor processes, the metal contamination concentration when using metal vacuum vessels is $5 \times E10$, which cannot satisfy a metal contamination concentration of $5 \times E9$, demanded by customers. In light of this, the damage inflicted by the plasma on the wall of the vacuum vessel 21 and the metal contamination arising from the vacuum vessel walls is greatly reduced compared to metal vacuum vessels, because in this embodiment, the vacuum vessel 21 is made of a dielectric material, such as quartz or alumina, so that the walls of the vacuum vessel 21, which come into contact with the plasma, are made of a dielectric material. As a result, metal contamination occurring at the surface of the substrate to be processed inside the vacuum vessel, which is caused by plasma-induced damages, can be greatly reduced, and the degree of metal contamination demanded by customers can be satisfied.

Furthermore, with this embodiment, the discharge electrode 29 is disposed outside the vacuum vessel 21, so that direct contact between the discharge electrode 29 and the plasma can be prevented. Thus, metal contamination caused when plasma damages are inflicted on the discharge electrode 29 can be prevented.

Furthermore, the vacuum vessel 21 is made of an upper vessel 22 and a lower vessel 23 and the upper vessel 22, which serves as the main part of the vacuum vessel 21, is dome-shaped and formed in one seamless piece except for its open bottom portion, so that the number of components for the apparatus can be greatly reduced, the assembly of the vacuum vessel 21 becomes easier, and the manufacturing costs of the apparatus can be reduced. Moreover, since the vacuum vessel 21 is made of a dielectric material, there is no need to make a portion of the vacuum vessel of a conducting material, such as an aluminum chamber, so that a confining of the plasma generation region can be prevented, and the plasma processing efficiency can be improved.

Moreover, the vacuum vessel 21 is provided with a multitude of shower holes 25 to supply gas uniformly, and the susceptor 33 on which the substrate W to be processed is placed is arranged at a position facing these shower holes 25, so that the gas flow becomes uniform, and the uniformity with which the substrate W is processed is improved even further. Especially when the distance from the gas shower holes 25 supplying the process gas to the substrate W to be processed is set to, for example, at least 10 cm, then the process gas can be adequately excited and high-speed processes become possible, because the distance from the gas shower holes 25 to the substrate W is sufficiently large.

Furthermore, the vertical position of the discharge electrode 29 and the permanent magnets 30 is arranged to be variable over a certain range by the position changer 102, then the plasma distribution can be controlled, so that it becomes possible to attain the optimum plasma distribution at the surface of the substrate w to be processed. As a result, the uniformity of the plasma processing of the substrate W can be improved, and plasma-induced damages can be suppressed.

Furthermore, in this embodiment, the auxiliary electrode 31 is provided on the outer periphery of the portion of the vacuum vessel 21 that is provided with the shower holes 25. If the discharge electrode 29 and the auxiliary electrode 31 are jointly supplied with high-frequency power, then it becomes possible to control the plasma processing efficiency at the periphery of the processed substrate W with the discharge electrode 29 and at the center of the processed substrate W with the auxiliary electrode 31, which improves the uniformity of the plasma processing of the substrate W.

Moreover, using the plasma, the auxiliary electrode 31 can effectively clean off the film deposited on the inner wall of the vacuum vessel at the peripheral portion of the gas shower holes 25. When the substrate surface is plasma processed, reaction products deposit on the vacuum vessel walls, and it is necessary to remove the deposited film regularly. Depending on the type of film that has deposited, the method for removing differs, but most films can be removed using a plasma. When the vacuum vessel 21 is cleaned with a plasma, then the cleaning rate is faster near the discharge electrode 29 where the plasma is generated for the most part, and the cleaning rate is lower at regions that are further away from the discharge electrode 29. Consequently, it is advantageous to employ the auxiliary electrode 31 at the periphery of the shower holes to increase the cleaning rate near the gas shower holes that are further away from the discharge electrode 29.

Moreover, with this embodiment, the high-frequency power that is output by the high-frequency electrodes 35 and 37 can be controlled independently with the controller 102. Thus, the plasma density at the edge portion and at the central portion of the plasma processing region 20 can be controlled independently. As a result, the plasma density and its uniformity can be controlled for the entire plasma processing region 20.

A conventional plasma processing apparatus with an ICP plasma source uses the same dome-shaped vacuum vessel (but without a shower head) as the similar modified magnetron high-frequency discharge plasma processing apparatus using the dome-shaped vacuum vessel of this embodiment. Comparing this conventional plasma processing apparatus with the plasma processing apparatus of the present invention, it can be seen that the plasma processing apparatus of the present invention is superior in the following aspects.

(1) Since the electron temperature is lower, the plasma-induced damage on the processed substrate is lower. Charge-up at the substrate surface tends to occur less than with parallel plate-type electrodes, so that plasma-induced damages are low, because the electric field acts on the wall of the vacuum vessel 21 but not on the susceptor.

(2) The plasma disperses, resulting in a substantially uniform plasma density at the substrate to be processed, so that the uniformity of the film thicknesses in plasma CVD films is good.

(3) The plasma power range of 100 W to 3 kW can cover a broad pressure range of 0.1 Pa to 10 Pa, so that the process window is wide.

Figure 4:
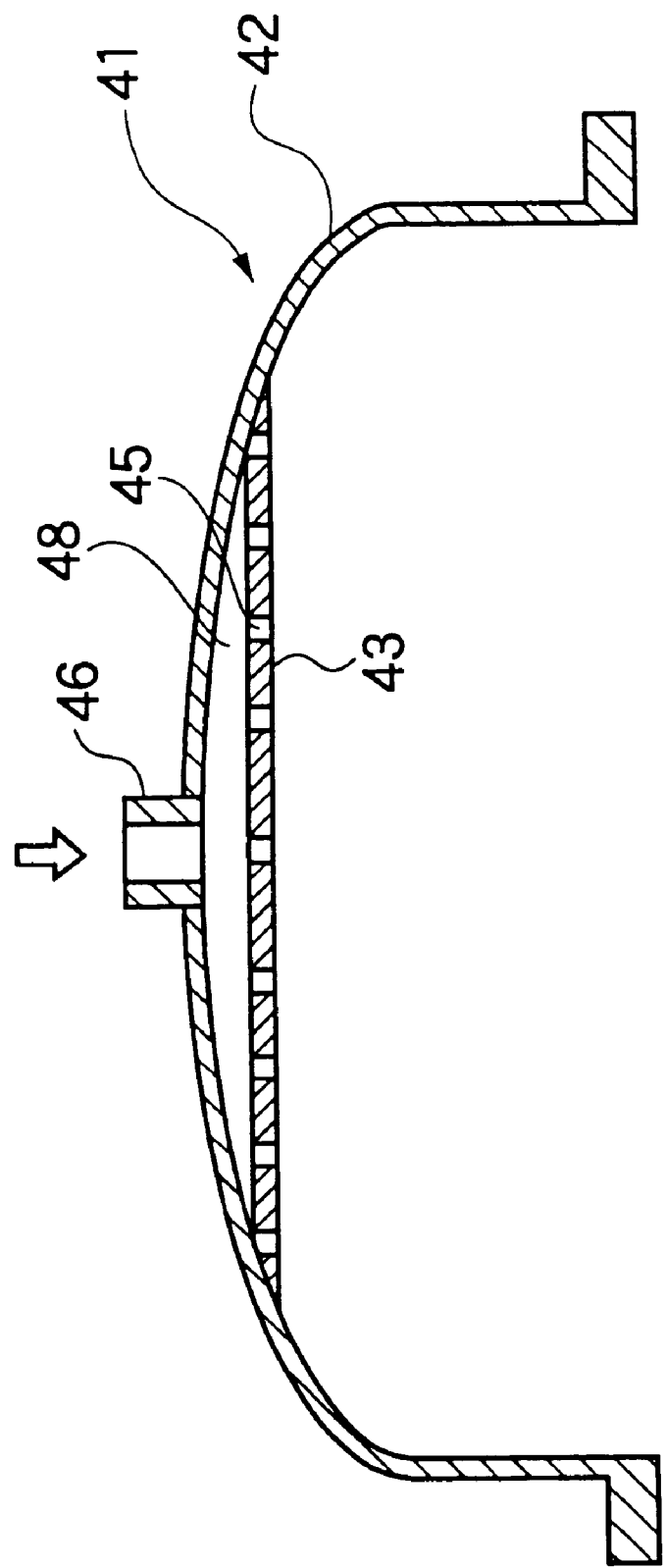
FIG. 4 is a schematic diagram of a plasma processing apparatus in an embodiment, in which the gas dispersion chamber is formed inside the vacuum chamber.

In the vacuum vessel 21 in FIG. 1, the upper portion of the upper vessel 22 is covered by the cover 27, and the gas dispersion chamber 28 is formed outside the vacuum vessel 21. However, it is also possible to form the gas dispersion chamber 28 inside the vacuum vessel 21. FIG. 4 shows such an embodiment, in which the gas supply port 46 is attached in one piece to the dome-shaped upper vessel 42. On the other hand, a disk-shaped gas shower plate 43 provided with a multitude of shower holes 45 is arranged to form the ceiling of the vacuum vessel 41, with the gas dispersion chamber 48 disposed on the rear side of the ceiling. Thus it becomes possible to arrange the gas dispersion chamber 48 inside the vacuum vessel 41.

Figure 5:
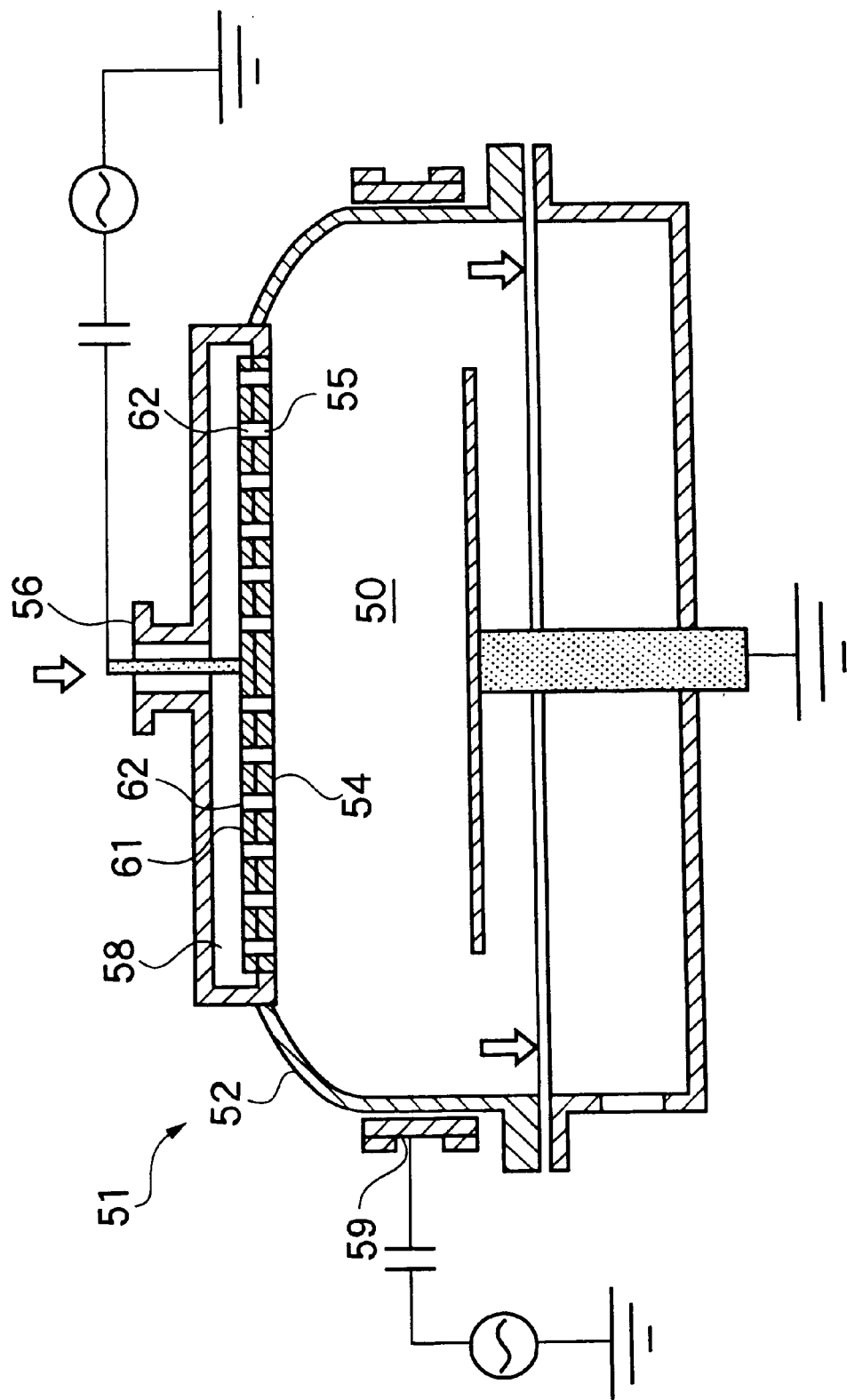
FIG. 5 shows a schematic cross-sectional view of a plasma processing apparatus in an embodiment, in which the auxiliary electrode is provided inside the gas dispersion chamber.

Furthermore, in the embodiment shown in FIG. 1, the auxiliary electrode 31 is arranged on the outer side of the outer periphery of the shower holes 25, outside the gas dispersion chamber 28. However, it is also possible to place the auxiliary electrode 31 inside the gas dispersion chamber. FIG. 5 shows such an embodiment, in which an auxiliary electrode 61 made of aluminum or a material that has been surface-treated with aluminum is provided inside the gas dispersion chamber 58 provided at the top of the vacuum vessel 51. That is to say, a disk-shaped auxiliary electrode 61 formed in correspondence to the gas shower plate 54 provided with the shower holes 55 is provided on the inlet side of the shower holes 55, which is on the opposite side of the plasma processing region 50 in the vacuum vessel 51. The process gas is ejected from the gas shower plate 54 into the vacuum vessel 51, so that large amounts of reaction products deposit easily on the surface of the gas shower plate 54. Therefore, if the auxiliary electrode 61 is arranged on the inlet side of the shower holes 55, the speed with which the reaction products that have deposited in large amounts on the surface of the gas shower plate are etched away 54 can be increased, and the cleaning efficiency can be improved even further.

The auxiliary electrode 61 shown in this example is provided in close contact to the rear surface of the gas shower plate 54 constituting the bottom of the gas dispersion chamber 58. Therefore, the top of the dome-shaped upper vessel 52, that is, the gas shower plate 54, is flat. It is also possible to provide the auxiliary electrode 61 in proximity. The auxiliary electrode 61 is provided with gas flow holes 62 at positions corresponding to the shower holes 55. Thus, gas can be supplied from the shower holes 55 without being obstructed by the auxiliary electrode 61, even when the auxiliary electrode 61 is provided in contact or in close proximity with the shower plate 54 with the shower holes 55.

Moreover, since the auxiliary electrode 61 is provided in contact or in close proximity with the shower plate 54, the cleaning efficiency at the shower holes 55 can be improved even further. Especially when the auxiliary electrode 61 is provided in direct contact on the rear face of the gas shower plate 54 as shown in the drawing, the speed with which the reaction products that have deposited in large amounts on the surface of the gas shower plate 54 are cleaned off can be increased considerably.

The gas flow holes 62 should be concentric to and slightly larger than the shower holes 55 formed in the gas shower plate 54. In that case, the gas flow supplied from the shower holes 55 is not obstructed when the relative position of the shower holes 55 and the gas flow holes 62 of the auxiliary electrode 61 is shifted during assembly. Furthermore, since the diameter of the shower holes 55 provided on the side of the plasma processing region 50 is not that large, abnormal plasma discharges do not occur.

The height of the gas dispersion chamber 58, that is, the spacing between the outlet of the gas supply port 56 and the gas shower holes 55 should be small enough to prevent abnormal discharges. It is preferable that the spacing with installed auxiliary electrode 61 is about 3 mm.

When the plasma processing apparatuses in FIGS. 1 and 5 are actually manufactured, the method with which the pair of permanent magnets is attached on the outside of the vacuum vessel becomes a factor influencing the ease with which the apparatus is assembled and the formation of a uniform magnetic field. This is explained with reference to FIGS. 6 and 7.

Figure 6:
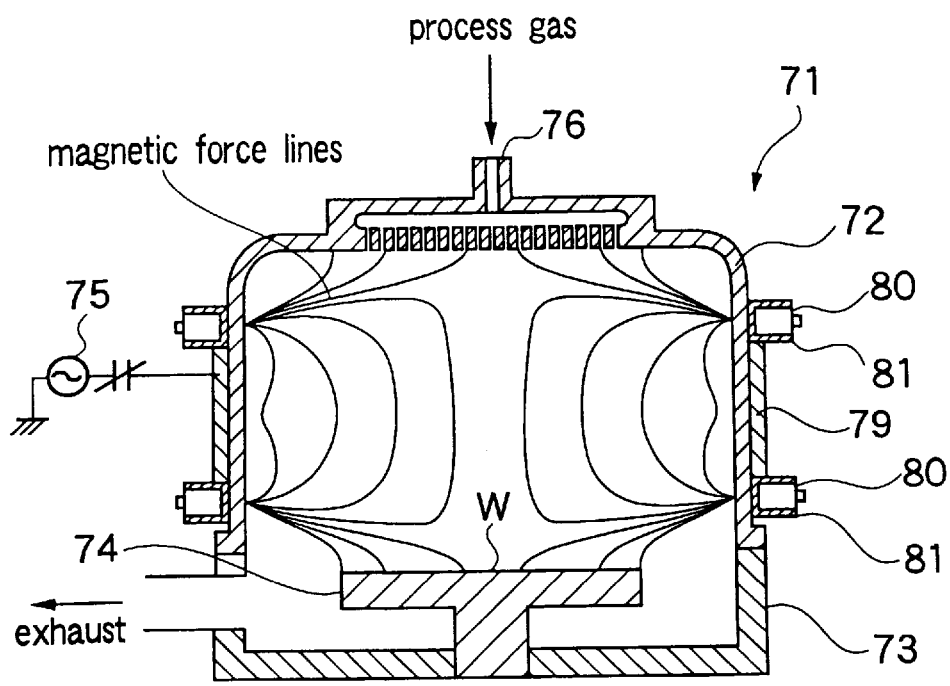
FIG. 6 shows a schematic cross-sectional view of a plasma processing apparatus in an embodiment, in which the magnets are attached to the holder by a holding fixture.

FIG. 6 is a cross-sectional view of a plasma processing apparatus. The vacuum vessel 71 includes a dome-shaped upper vessel 72 made of an insulating ceramic that can hold a vacuum, and a lower vessel 73 fastened tightly to the upper vessel 72. The vacuum is preserved by an O-ring between the upper vessel 72 and the lower vessel 73. The top of the upper vessel 72 is provided with a gas supply port 76 supplying a reaction gas as a shower. A susceptor 74 on which the substrate W to be processed is placed is arranged inside the vacuum vessel 71. Then, a tubular discharge electrode 79 is attached to the outer peripheral wall of the upper vessel 72. A high-frequency power source 75 is connected to the disk-shaped electrode 79, and supplies high-frequency power to the electrode 79. An upper permanent magnet 80 and a lower permanent magnet 80 for generating a magnetic field are attached in rings above and below the tubular discharge electrode 79. Here, magnet holders 81 are used to attach the upper and lower permanent magnets 80.

Figure 7:
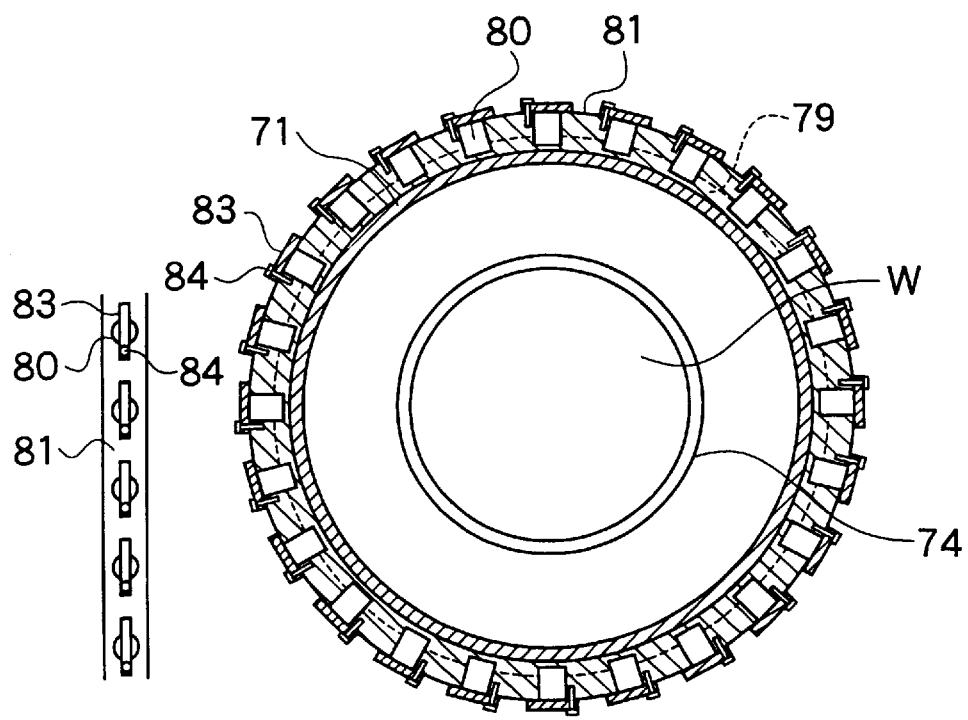
FIG. 7 is a plan view of the plasma processing apparatus in FIG. 6.

FIG. 7 is a plan view of this vacuum vessel 71. As can be seen from this drawing, a multitude of rod-shaped permanent magnets 80 are used here.

The thicker tubular magnet holders 81 are fitted around the tubular discharge electrode 79. The magnet holders 81 are provided with a plurality of fitting holes at equidistant spacings in circumferential direction, and these fitting holes face in radial direction inside. The rod-shaped magnets 80 are fitted axially into the fitting holes.

Either the magnets 80 on the upper side or the magnets 80 on the lower side are arranged so that their N poles face toward the center of the vacuum vessel 71, whereas the other magnets are arranged so that their S poles face toward the center of the vacuum vessel 71. It is preferable that the magnets 80 are arranged symmetrically with respect to the vertical center of the tubular electrode 79. Thus, the magnetic force lines run in tube axis direction along the inner peripheral surface of the tubular electrode 79.

The heads of the rod-shaped magnets 80 fitted into the magnet holders 81 are pressed with a magnet holding fixture 83 from the outside of the vacuum vessel 71 toward the inner side and are fastened to the magnet holder 81 with screws 84. Thus the pair of upper and lower permanent magnets 80 are disposed in an approximately tubular arrangement.

With this embodiment, the magnet disposed around the vacuum vessel 71 is configured as a plurality of permanent magnets 80 arranged around the vacuum vessel 71, so that the handling and the magnetizing of the magnets is easier and the magnet can be manufactured cheaper than if the magnet is configured as only one permanent magnet.

Figure 8:
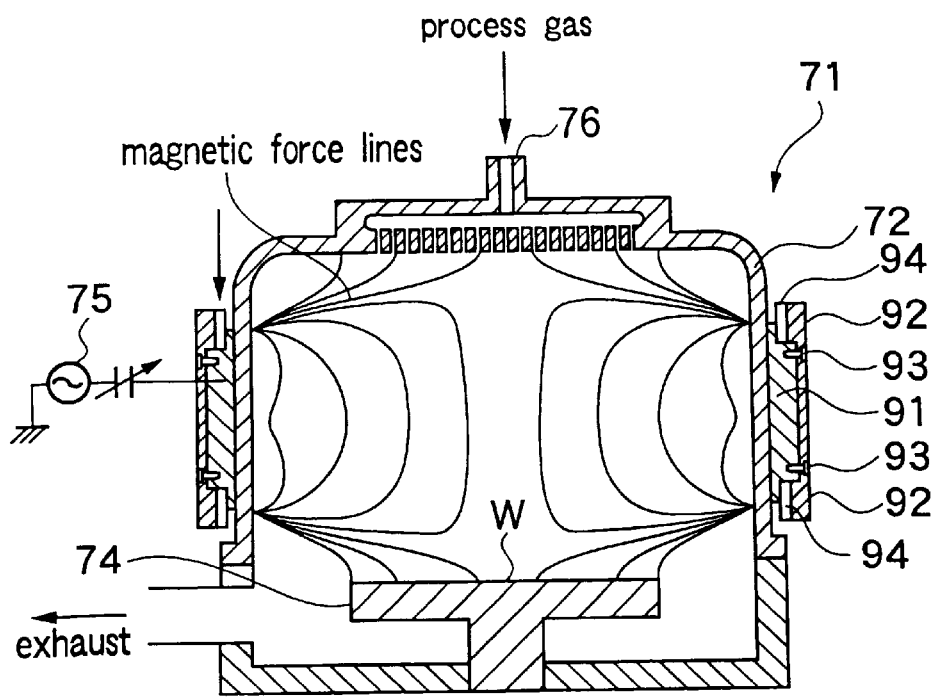
FIG. 8 shows a schematic cross-sectional view of a plasma processing apparatus in an embodiment, in which a yoke attaches the magnets to the electrode in an integrated structure.
Figure 9:
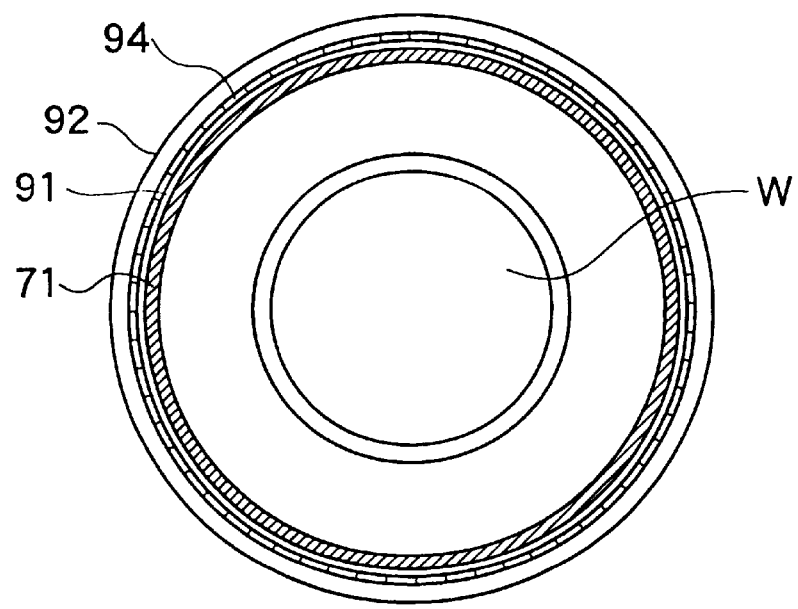
FIG. 9 is a plan view of the plasma processing apparatus in FIG. 8.

FIGS. 8 and 9 show another configuration of the magnet disposed around the vacuum vessel.

In the embodiment shown in FIGS. 8 and 9, the magnet is arranged around the vacuum vessel 71 by arranging a plurality of permanent magnets 94 along the circumference of the vacuum vessel 71, like in the embodiment shown in FIGS. 6 and 7.

However, in the embodiment shown in FIGS. 6 and 7, a magnet holder 81 having a plurality of fitting holes is provided for holding a plurality of permanent magnets 80, and the plurality of permanent magnets 80 are held in place by fitting the permanent magnets 80 into the fitting holes of the magnet holder 80.

In the embodiment shown in FIGS. 8 and 9, on the other hand, the permanent magnets 94 are held in place by sandwiching them between a tubular discharge electrode 91 and a magnetic yoke 92 forming a magnetic circuit.

With this configuration, the plurality of permanent magnets 94 can be held even easier than with the embodiment of FIGS. 6 and 7, so that the magnets can be assembled easily.

Moreover, with this configuration, the plurality of permanent magnets 94 can be lined up without gaps. Also, lining them up in this manner, there is no need to provide the permanent magnets 94 with a circular profile, because in the configuration of FIGS. 8 and 9, different from the configuration of FIGS. 6 and 7, there is no need to ensure the holes for fitting the permanent magnets. Thus, a rectangular a square profile can be chosen for the permanent magnets 94. As a result, the magnetic field with respect to the circumferential direction of the vacuum vessel 71 can be made even more uniform than in the embodiment shown in FIGS. 6 and 7.

Moreover, with this configuration, the length of the permanent magnets 94 (that is, the length in the direction connecting the two poles) can be made shorter. This is, because the permanent magnets 94 are not held by fitting them into holes, but by sandwiching them between the discharge electrode 91 and the magnetic yoke 92. Thus, the permanent magnets 94 can be provided with rectangular plate-shape. As a result, the radius of the magnet formed by the plurality of permanent magnets 94 can be reduced. Thus, the plasma processing apparatus shown in FIGS. 6 and 7 can be made even smaller.

The following is a more detailed explanation of the configuration of the embodiment shown in FIGS. 8 and 9. As explained above, in this embodiment, (1) a magnetic yoke 92 forming a magnetic circuit is arranged around the tubular discharge electrode 91, and a plurality of permanent magnets 94 are clamped between the discharge electrode 91 and the magnetic yoke 92, and (2) each permanent magnet 94 is formed in the shape of a rectangular or a square board, so that they can be arranged without gaps around the discharge electrode 91.

In the FIGS. 8 and 9, the tubular discharge electrode 91 disposed around the vacuum vessel 71 has an atypical cross-section. That is to say, its upper and lower edge portions are thinner than its central portion, so that its sheet thickness varies over the cross-section. Overlapping with this discharge electrode 91, the magnetic yoke 92 made of a magnetic material, such as iron, forming a magnetic circuit is fastened with screws 93 around this discharge electrode 91. The magnets 94 are arranged in segments of the shape of a rectangular or a square board. Fastening the magnetic yoke 92 to the discharge electrode 91, the segment-shaped magnets 94 are inserted in tube-axis direction into the vertical gap formed between the tubular electrode 91 and the magnetic yoke 92, and fixed with an adhesive. Thus, the permanent magnets 94 are sandwiched between the discharge electrode 91 and the magnetic yoke 92, whereby the pair of permanent magnets 94 is connected by the magnetic yoke 92 and formed in one integrated structure with the discharge electrode 92.

Consequently, the discharge electrode 91 and the permanent magnets 94 can be arranged outside the vacuum vessel 71 in a simple integrated structure, in which the permanent magnets 94 are sandwiched by the discharge electrode 91 and the magnetic yoke 92. As a result, it becomes possible to make the assembly easy from the embodiment shown in FIGS. 6 and 7. Moreover, using an electrode into which the permanent magnets 94 have been integrated, a predetermined magnetic field can be attained with thin-sheeted permanent magnets 94, because the magnetic yoke 92 forms part of the magnetic circuit in radial direction. Furthermore, the radial dimension of the apparatus can be reduced, and the overall size of the vacuum vessel 71 can be reduced, because the permanent magnets 94 are not held by screws 84 and a magnet holding fixture 83, as the embodiment shown in FIGS. 6 and 7. Using thinner permanent magnets 94, the vacuum vessel 71 can be made even smaller.

With the present invention, a tubular first electrode is arranged outside the vacuum vessel, which makes the assembly of the apparatus easier. Moreover, since the tubular first electrode is arranged outside the vacuum vessel, the sealing properties of the vacuum vessel can be improved, and the pressure in the vacuum vessel can be reduced to a high vacuum.

Moreover, since the first electrode does not come into direct contact with the plasma, metal impurities arising when plasma damages are inflicted on the first electrode can be prevented.

Furthermore, since at least a surface of the vacuum vessel is made of a dielectric material, such as quartz, metal impurities arising when plasma damages are inflicted on the vacuum vessel can be prevented.

What is claimed is:

1. A plasma processing apparatus comprising:
    a vacuum vessel made of a dielectric material, defining a plasma processing region inside;
    a gas supply/exhaust system that supplies/exhausts gas to/from said vacuum vessel;
    a tubular first electrode provided around the outside of said vacuum vessel and inducing discharges in the gas supplied to said vacuum vessel;
    a magnet provided around the outside of said vacuum vessel; and
    a high-frequency power apply system that applies high-frequency power to said tubular first electrode;
    wherein a plasma is generated inside said vacuum vessel by applying high-frequency power to said tubular first electrode.

2. The plasma processing apparatus according to claim 1,
    wherein said vacuum vessel comprises an upper vessel and a lower vessel; and
    wherein said upper vessel is a dome-shaped structure, except that it has an open bottom portion.

3. The plasma processing apparatus according to claim 1, having shower holes for uniformly supplying the gas to said vacuum vessel;
    wherein a susceptor, on which a substrate to be processed is placed, is arranged at a position facing the shower holes.

4. The plasma processing apparatus according to claim 3, wherein a second electrode is arranged at an outer peripheral portion of said shower holes, outside said vacuum vessel.

5. The plasma processing apparatus according to claim 3, wherein a second electrode is arranged on the inlet side of the shower holes, which is opposite the side of the plasma processing region of said vacuum vessel.

6. The plasma processing apparatus according to claim 1, wherein said magnet is made of a plurality of permanent magnets, which are held in place by fitting them into fitting holes of a magnet holder provided around the outside of the vacuum vessel.

7. The plasma processing apparatus according to claim 1, wherein the magnet is made of a plurality of permanent magnets, which are held in place by sandwiching them between said first electrode and a magnetic yoke provided around the outside of the vacuum vessel.

8. The plasma processing apparatus according to claim 1, wherein said magnet includes
    a first magnet provided in the vicinity of the upper end of said discharge electrode; and
    a second magnet provided in the vicinity of the lower end of said discharge electrode.

9. The plasma processing apparatus according to claim 1, wherein said magnet is made of a plurality of permanent magnets, which are held in place by fitting them into a fitting gap of a magnet holder provided around the outside of the vacuum vessel.

10. A plasma processing apparatus comprising:
    a vacuum vessel comprising an upper vessel and a lower vessel, among which at least said upper vessel being made of a dielectric material, and defining a plasma processing region inside;
    a gas supply/exhaust system that supplies/exhausts gas to/from said vacuum vessel;
    a tubular first electrode provided around the outside of said upper vessel and inducing discharges in the gas supplied to said vacuum vessel;
    a magnet provided around the outside of said upper vessel; and
    a high-frequency power apply system that applies high-frequency power to said tubular first electrode;
    wherein a plasma is generated inside said vacuum vessel by applying high-frequency power to said tubular first electrode.

11. The plasma processing apparatus according to claim 10, wherein said magnet includes
    a first magnet provided in the vicinity of the upper end of said discharge electrode; and
    a second magnet provided in the vicinity of the lower end of said discharge electrode.

12. The plasma processing apparatus according to claim 10, wherein said upper vessel is a dome-shaped structure, except that it has an open bottom portion.

13. The plasma processing apparatus according to claim 10, wherein said dielectric material is quartz.

14. The plasma processing apparatus according to claim 10, wherein said dielectric material is alumina.

15. The plasma processing apparatus according to claim 10, wherein said dielectric material is ceramic.

16. The plasma processing apparatus according to claim 10, wherein a substrate to be processed is arranged the inside of said upper vessel and is processed there.

17. The plasma processing apparatus according to claim 10, wherein said magnet is made of a plurality of permanent magnets, which are held in place by fitting them into a fitting gap of a magnet holder provided around the outside of the vacuum vessel.

18. The plasma processing apparatus according to claim 10, wherein the magnet is made of a plurality of permanent magnets, which are held in place by sandwiching them between said first electrode and a magnetic yoke provided around the outside of the vacuum vessel.

* * * * *